(12) United States Patent
Lam et al.

(10) Patent No.: US 7,606,067 B2
(45) Date of Patent: Oct. 20, 2009

(54) METHOD TO CREATE A UNIFORMLY DISTRIBUTED MULTI-LEVEL CELL (MLC) BITSTREAM FROM A NON-UNIFORM MLC BITSTREAM

(75) Inventors: Chung H. Lam, Peekskill, NY (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 11/774,539

(22) Filed: Jul. 6, 2007

(65) Prior Publication Data
US 2009/0013146 A1 Jan. 8, 2009

(51) Int. Cl.
*G11C 16/04* (2006.01)
(52) U.S. Cl. .............................. 365/185.03; 365/189.17
(58) Field of Classification Search ............ 365/185.03, 365/189.17
See application file for complete search history.

(56) References Cited

U.S. PATENT DOCUMENTS

| 5,926,411 A | * | 7/1999 | Russell | 365/106 |
| 6,320,812 B1 | * | 11/2001 | Cook et al. | 365/230.03 |
| 7,173,857 B2 | * | 2/2007 | Kato et al. | 365/185.21 |
| 7,480,184 B2 | | 1/2009 | Lam | 365/185.24 |

* cited by examiner

*Primary Examiner*—Tuan T. Nguyen
(74) *Attorney, Agent, or Firm*—Ido Tuchman; Vazken Alexanian

(57) ABSTRACT

A method, system, and computer software product for operating a collection of memory cells. Each memory cell in the collection of memory cells is configured to store a binary multi-bit value delimited by characteristic parameter bands. In one embodiment, a transforming unit transforms an original collection of data to a transformed collection of data using a reversible mathematical operator. The original collection of data has binary multi-bit values arbitrarily distributed across the binary multi-bit values assigned to the characteristic parameter bands and the transformed collection of data has binary multi-bit values substantially uniformly distributed across the binary multi-bit values assigned to the characteristic parameter bands.

30 Claims, 7 Drawing Sheets

METHOD TO CREATE A UNIFORMLY DISTRIBUTED MULTI-LEVEL CELL (MLC) BITSTREAM FROM A NON-UNIFORM MLC BITSTREAM

CROSS-REFERENCE TO RELATED APPLICATIONS

This application contains subject matter which is related to the subject matter of the following co-pending application, which is assigned to the same assignee as this application, International Business Machines Corporation of Armonk, N.Y. The below listed application is hereby incorporated herein by reference in its entirety:

U.S. patent application Ser. No. 11/620,704 filed Jan. 7, 2007, titled "MAXIMUM LIKELIHOOD STATISTICAL METHOD OF OPERATIONS FOR MULTI-BIT SEMICONDUCTOR MEMORY".

BACKGROUND OF THE INVENTION

1. Field of the Invention

The present invention relates to operation of memory storage systems, and more particularly to uniformly distributed data storage using statistical methods and mathematical transformations to help correct data storage errors in multi-bit memory cells.

2. Description of Background

Typical semiconductor computer memories are fabricated on semiconductor substrates consisting of arrays of large number of physical memory cells. In general, one bit of binary data is represented as a variation of a physical parameter associated with a memory cell. Commonly used physical parameters include threshold voltage variation of the Metal Oxide Field Effect Transistor (MOSFET) due to the amount of charge stored in a floating gate or a trap layer in non-volatile Electrically Erasable Programmable Read Only Memory (EEPROM), resistance variation of the Phase Change memory element in Phase-change Random Access Memory (PRAM) or Ovonic Unified Memory (OUM), and charge storage variation in volatile Dynamic Random Access Memory (DRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as Multi-Level Cell (MLC). Significant amount of efforts in computer memory device and circuit designs are devoted to maximize the number of bits to be stored in a single physical memory cell. This is particularly true with storage class memory such as popular non-volatile Flash memories commonly used as mass storage device.

The basic requirement for multiple bit storage in a semiconductor memory cell is to have the spectrum of the physical parameter variation to accommodate multiple non-overlapping bands of values. The number of bands required for an n-bit cell is $2^n$. A 2-bit cell needs 4 bands, a 3-bit cell needs 8 bands and so forth. Thus, the available spectrum of a physical parameter in a semiconductor memory cell is the limiting factor for multiple bit memory storage.

In addition to the limiting spectrum width, fluctuations in environmental variables such as temperature, power, and time affect all operations and data integrity of a typical semiconductor storage device. Data integrity is a major problem for data storage systems due to the fluctuations in the environment variables. It is desirable to devise a cost effective method to preserve the integrity of the stored data in semiconductor storage systems.

SUMMARY OF THE INVENTION

An exemplary embodiment of the present invention is a method for operating a collection of memory cells. The collection of memory cells contains a plurality of memory cells. Each memory cell in the collection of memory cells stores a binary multi-bit value delimited by characteristic parameter bands of a characteristic parameter.

The method for memory controller operation entails dividing a characteristic parameter in the collection of memory cells into a plurality of characteristic parameter bands. A binary multi-bit value is assigned to each of the characteristic parameter bands. A receiving operation receives an original collection of data. In addition, the original collection of data has binary multi-bit values arbitrarily distributed across the binary multi-bit values assigned to the plurality of characteristic parameter bands.

A transforming operation transforms the original collection of data into a transformed collection of data using a reversible mathematical operator. The transformed collection of data has binary multi-bit values substantially uniformly distributed across the binary multi-bit values assigned to the plurality of characteristic parameter bands. A storing operation stores the transformed collection of data as characteristic parameter values representing the binary multi-bit values in the collection of memory cells.

In a particular embodiment of the invention, the method for memory controller operation includes a second receiving operation and a second transforming operation. The second receiving operation receives the transformed collection of data from the collection of memory cells and transforms the transformed collection of data back to the original collection of data using an inverse mathematical operator. The inverse mathematical operator is the inverse operator of the reversible mathematical operator.

Another exemplary embodiment of the invention is a memory device. The memory device includes memory cells organized into collections of memory cells. Each memory cell in the collection of memory cells is configured to store a binary multi-bit value delimited by characteristic parameter bands of a characteristic parameter.

A receiving unit in the memory device is configured to receive an original collection of data. The original collection of data has binary multi-bit values arbitrarily distributed across the binary multi-bit values assigned to the plurality of characteristic parameter bands. A transforming unit in the memory device is configured to transform the original collection of data to a transformed collection of data using a reversible mathematical operator. The transformed collection of data has binary multi-bit values substantially uniformly distributed across the binary multi-bit values assigned to the plurality of characteristic parameter bands. A storing unit in the memory device is configured to store the transformed collection of data as characteristic parameter values representing binary multi-bit values in the collection of memory cells.

In a particular embodiment of the invention, the receiving unit is further configured to receive the transformed collection of data from the collection of memory cells. Additionally, the transforming unit is further configured to transform the transformed collection of data back to the original collection of data using an inverse mathematical operator. The inverse mathematical operator is the inverse operator of the reversible mathematical operator.

Yet another exemplary embodiment of the invention is a computer program comprising a tangible computer readable medium embodying computer program code for operating at least one collection of memory cells. Each memory cell in the collection of memory cells is configured to store a binary multi-bit value delimited by characteristic parameter bands of a characteristic parameter.

The computer program contains computer executable instructions configured to receive an original collection of data. The original collection of data has binary multi-bit values arbitrarily distributed across the binary multi-bit values assigned to the plurality of characteristic parameter bands. The computer executable instructions are also configured to transform the original collection of data into a transformed collection of data using a reversible mathematical operator. The transformed collection of data has binary multi-bit values substantially uniformly distributed across the binary multi-bit values assigned to the plurality of characteristic parameter bands. Additionally, the computer executable instructions are configured to store the transformed collection of data as characteristic parameter values representing the binary multi-bit values in the collection of memory cells.

In a particular embodiment of the invention, the computer program further comprises computer executable instructions configured to receive the transformed collection of data from the collection of memory cells. The computer executable instructions are also configured to transform the transformed collection of data back to the original collection of data using an inverse mathematical operator. The inverse mathematical operator is the inverse operator of the reversible mathematical operator.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
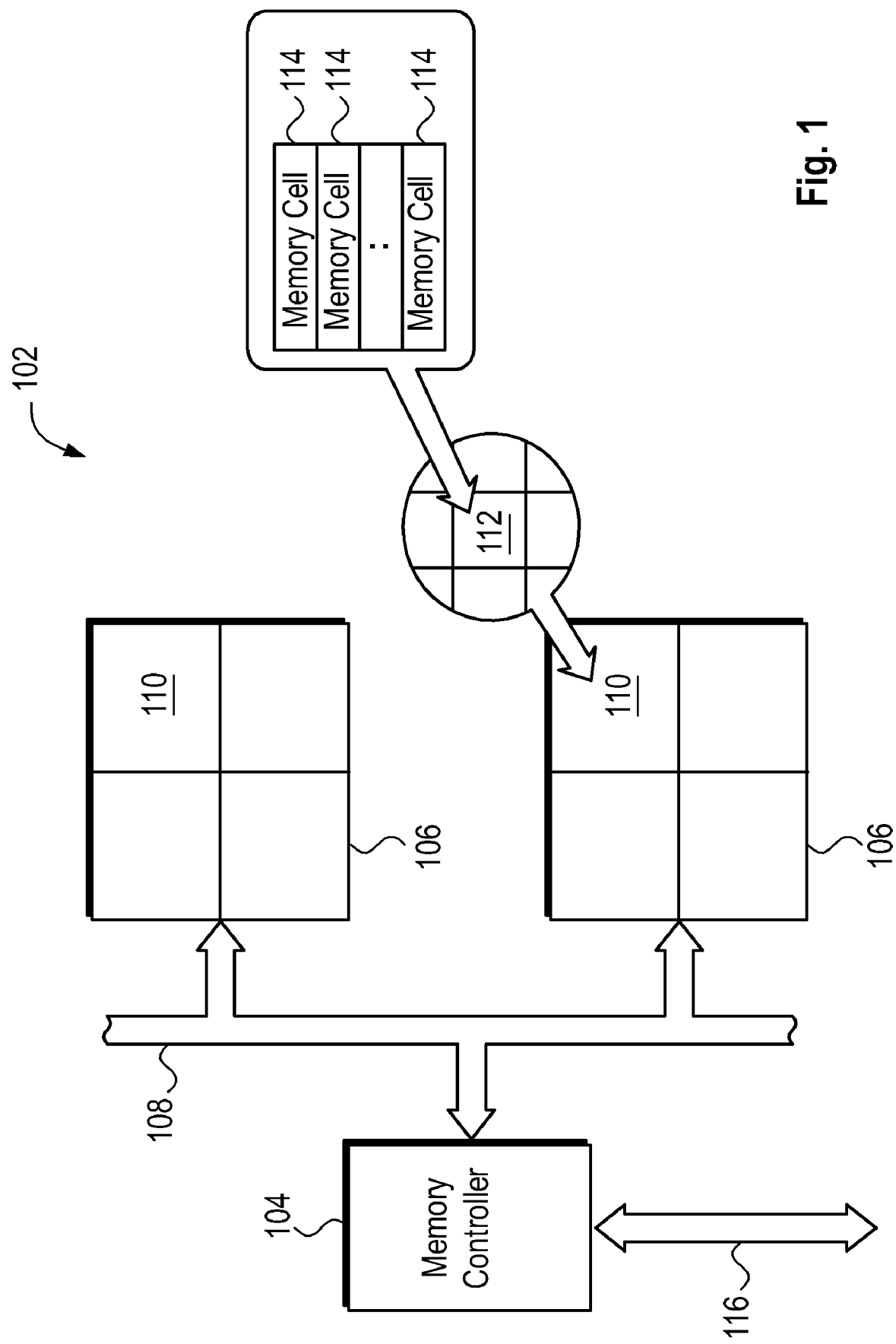
FIG. 1 illustrates a particular embodiment of a memory system in accordance with the present invention.

The detailed description explains the preferred embodiments of the invention, together with advantages and features, by way of example with reference to the drawings.

DETAILED DESCRIPTION OF THE INVENTION

The present invention will be described with reference to FIGS. 1-6. When referring to the figures, like elements shown throughout are indicated with like reference numerals.

FIG. 1 illustrates an exemplary embodiment for a memory cell system 102. The system includes a memory controller 104 coupled to one or more memory units 106 via a memory bus 108.

The memory units 106 may be individually packaged memory chips or the memory units 106 may exist in a single package multiplexed together. Furthermore, the memory controller 104 may be separately packed or incorporated with the memory units 106.

The memory units 106 are not limited to a particular memory storage technology. Those skilled in the art will recognize that different memory technologies use different characteristic parameters to store data. For example, Random Access Memory (DRAM) technology uses charge storage variation as a characteristic parameter to retain binary data. Phase Change Memory (PCM) and Resistive Random Access Memory (RRAM) technology use resistance variation as a characteristic parameter to store binary data. The memory cell system 102 only needs to be bound to a common characteristic parameter for all memory cells 114.

As shown, each memory unit 106 is divided into a plurality of collections of memory cells. Each collection of memory cells 110 is comprised of multiple groups of memory cells 112. Each group of memory cells 112 contains a plurality of memory cells 114. Moreover, each individual memory cell 114 contains at least one possible binary value by associating the binary values with a characteristic parameter band in the memory cell. The characteristic parameter bands are delimited by preset value ranges of a characteristic parameter during a store operation 208 to be further described in FIG. 2. For proper performance of the present error detection and correction scheme, the memory cells 114 within a collection of memory cells 110 are physically located in proximity with each other, are written and read at about the same time, and therefore undergo similar characteristic parameter perturbation and deterioration.

In one embodiment, the memory controller 104 receives a command and the corresponding data from the central processing unit (CPU) through an instruction/data bus 116 to program a collection of memory cells 110.

Figure 2:
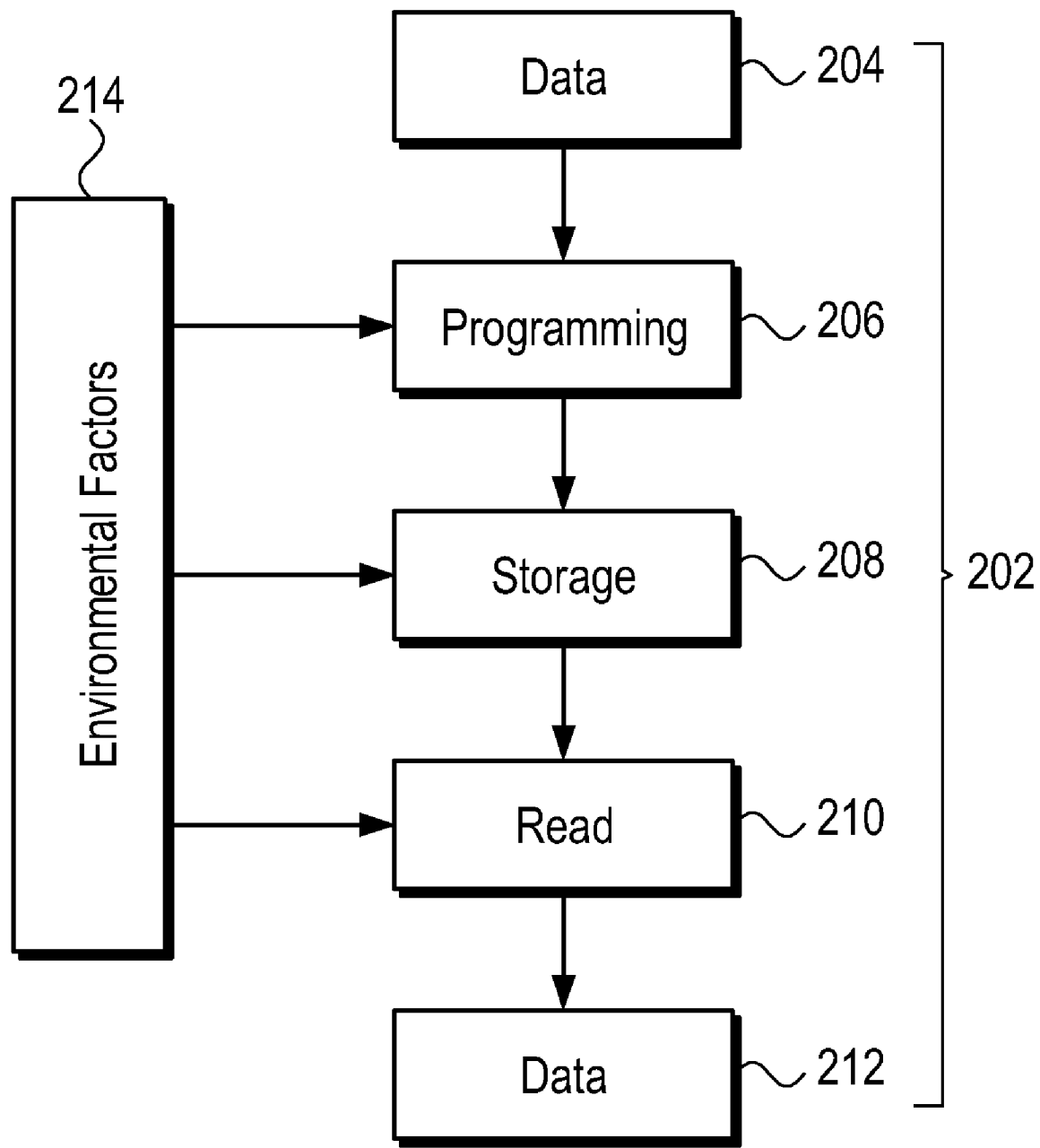
FIG. 2 illustrates the environmental effects on memory system operations.

Turning to FIG. 2, a memory cell operation procedure 202 according to the present invention is shown. At step 204, data to be stored is acquired. The data may come from various sources, such as a Central Processing Unit (CPU) or a peripheral device coupled to the memory unit containing the memory cell.

At programming operation 206, the acquired data is written into the memory cell. Depending on the storage technology used, writing data may consist of storing charge in a capacitor for charge storage, applying voltage to the source, drain, or control gate in a floating gate transistor for threshold voltage variation, melting and cooling the phase change material to change optical refractive index, or melting and cooling phase change material to change resistance. After the data is written into memory, it is stored for a period of time at storing operation 208.

At a later time after the storing operation 208, the data is retrieved from the memory cell during reading operation 210. The exact process for retrieving the data again depends on the technology used. For example, when reading DRAM memory, transistors are activated connecting the memory cell capacitors to sense lines. When reading a PCM memory cell, a current is passed through the cell's phase-change material. The data is finally retrieved at step 212.

The environment 214 (both internal and external to the memory cell) affects the programming 206, storing 208, and reading 210 operations of the memory cell operation procedure 202. Environmental factors such as, but not limited to, humidity, time, temperature, magnetic fields, and electrical fields may cause charge leakage in DRAM, threshold voltage shifts in EEPROM, optical refractive index variation in phase change material of optical memory, or change the resistance levels in PCM and RRAM. More generally, the characteristic parameter used to delineate binary values in the memory cell may shift over time due to environmental conditions. The environmental factors 214 cause data distortion so that the data extracted from the memory cell may not be the same as the data input to the memory cell.

As discussed below, an embodiment of the present invention is an operating procedure that compensates for shifts in the characteristic parameter over time using statistical operations and mathematical transformations to maximize statistical precision. In particular, an embodiment of the present invention is an operating procedure that transforms an original collection of data having multi-bit values arbitrarily distributed across the binary multi-bit values assigned to the plurality of characteristic parameter bands to a transformed collection of data having multi-bit values substantially uniformly distributed across the binary multi-bit values assigned to the plurality of characteristic parameter bands. The transformed collection of data is stored and later retrieved while compensating for the shifts in the characteristic parameter by statistical methods. An embodiment of the present invention also enables the recovery of the original collection of data from the collection of memory cells.

Figure 3:
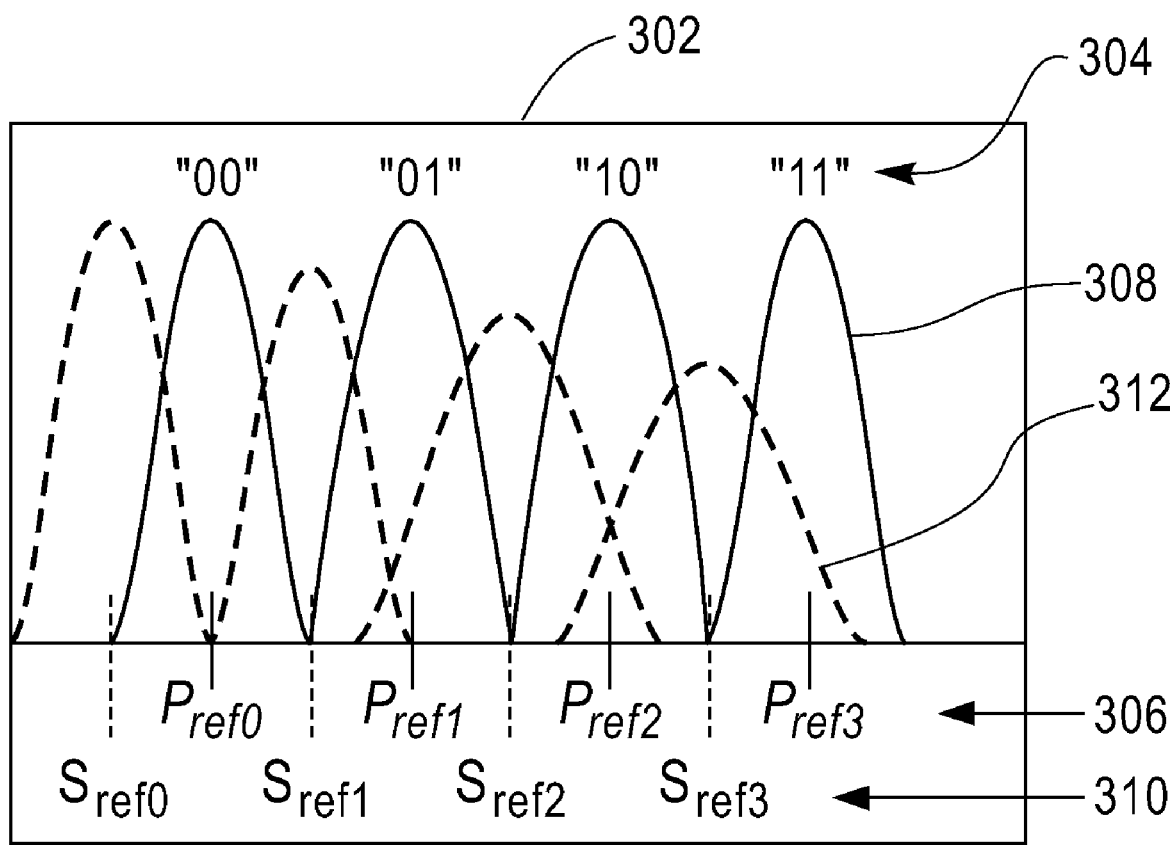
FIG. 3 illustrates a characteristic parameter distribution in an exemplary memory cell collection of the present invention.

FIG. 3 shows a distribution for a collection of memory cells 302. In particular, FIG. 3 illustrates the underlying concept of the invention for a 2-level multi-bit logic. As illustrated, each binary multi-bit value 304 is assigned to an initial characteristic parameter band 308. The initial characteristic parameter bands 308 are centered on a preset characteristic parameter reference value 306 (e.g., designated as parameters $P_{ref0}$-$P_{ref3}$). When programming a memory cell to store a binary multi-bit value, the characteristic parameter value for the memory cell is programmed to the preset characteristic parameter reference value 306.

Ideally, binary multi-bit values 304 in the collection of memory cells are represented by precise characteristic parameter values exactly equaling the preset characteristic parameter reference values 306. In practice, however, the characteristic parameter values form bands (typically Gaussian distribution curves) centered about the preset characteristic parameter reference values 306. This is typically due to natural variations during memory cell manufacturing. Thus, the preset characteristic parameter reference values 306 ($P_{ref0}$-$P_{ref3}$) are mean values of the characteristic parameter when data is initially programmed in the collection of memory cells. Furthermore, the characteristic parameter values shift as a result of environmental factors over time, as discussed herein.

FIG. 3 also illustrates the shifting of characteristic parameter values as a result of environmental factors in the form of the characteristic parameter bands that the values form. As illustrated shifted characteristic parameter bands 312 are no longer centered on the preset characteristic parameter reference values 306 but centered on shifted characteristic parameter reference values 310 (e.g., designated as parameters $S_{ref0}$-$S_{ref3}$) The characteristic parameter values are shifted towards the left from the initial characteristic parameter bands 308 which represent a lower potential energy configuration of the characteristic parameter in the memory cell within the storage or operating environment. In general, the shift is more pronounced and the dispersion is wider farther away from the lowest potential energy configuration. For example, the characteristic parameter in FIG. 3 may represent the apparent threshold voltages of a collection of memory cells of Flash EEPROM in which the apparent threshold voltage is an increasing function of the number of electrons stored in the floating gate, and the lowest potential energy configuration is no electron stored corresponding to lowest apparent threshold voltage.

The memory controller beneficially compensates for decays in characteristic parameter values by not only reading the characteristic parameter value of a target memory cell in the collection of memory cells, but also of the characteristic parameter values of all the memory cells in the collection of memory cells. In data retrieval, the memory controller receives a high precision characteristic parameter value for each memory cell in the collection of memory cells and fits the dispersed and shifted characteristic parameter bands with probable distribution curves by statistical methods.

The characteristic parameter value of a target memory cell is evaluated against the shifted characteristic parameter bands 312 constructed and the most likely binary multi-bit value for the target memory cell is determined by choosing the band with the highest probability value. Any memory cell in the collection of memory cells can be a target memory cell. In this manner, the binary multi-bit values of all the memory cells in the collection of memory cells can be retrieved. The shifted characteristic parameter bands 312 of the collection of memory cells are reconstructed each time the target memory cell or a group of memory cells or the entire collection of memory cells is read. This may include that the data is rewritten or restored after a threshold time interval and/or when a memory cell is programmed or reprogrammed.

In one embodiment, the shifted characteristic parameter bands 312 are created by a probability distribution function, $$P(x_1^k, \ldots, x_{n_k}^k \mid \mu_k, \sigma_k^2) = \left(\frac{1}{2\pi\sigma_k^2}\right)^{\frac{n_k}{2}} e^{-\frac{\sum_{i=1}^{n_k}(x_i^k - \overline{x^k})^2 + n_k(\overline{x^k} - \mu_k)^2}{2\sigma_k^2}}$$

where $n_k$ is the number of memory cells with a characteristic parameter in the k th value range, m is the number of bit storage values per memory cell, and $x^k$ is the value of the characteristic parameter value read from a memory cell pertaining to a specific band, not x to the k th power; so, $x_1^1$ would indicate the first characteristic parameter from the first characteristic parameter band in the collection of memory cells. The number of bands (k) and the mean of the characteristic parameter values read ($\overline{x^k}$) are defined by, $$k = 1, \ldots, 2^m, \overline{x^k} = \frac{1}{n_k}\sum_{i=1}^{n_k} x_i^k.$$

Additionally, $\mu_k$ is the mean of the k th band, also used as the reference points $P_{ref}$ and $\sigma_k^2$ is the variance of the k th band.

A maximum likelihood estimator is given by, $$\hat{\theta}_k = (\hat{\mu}_k, \hat{\sigma}_k^2) = \left(\overline{x^k}, \sum_{i=1}^{n_k}(x_i^k - \overline{x^k})^2 / n_k\right)$$

where $\hat{\mu}_k$ is the mean estimator of the k th band and $\hat{\sigma}_k^2$ is the variance estimator of the k th band. The maximum likelihood estimator is used to determine the band to which a particular value belongs, and in turn the binary multi-bit value a memory cell stores, by using a least squares method. A sensed value from the memory cell is placed in each individual band of the collection of memory cells and a band probability is assigned to each memory cell based on the value and its relation to the mean of each band, thereby creating shifted characteristic parameter reference values 312 ($S_{ref0}$-$S_{ref3}$) each with assigned binary multi-bit value 304.

A problem in constructing shifted characteristic parameter bands arises when the number of memory cells with characteristic parameter values in each initial characteristic parameter band 308 is highly non-uniform. A high degree of variance in the number of memory cells with characteristic parameter values in each initial characteristic parameter band 308 creates problems in the relative sample sizes of each initial characteristic parameter band 308 resulting in varying levels of precision. Lower relative sampling size results in lower statistical precision rendering statistical operations ineffective. A related problem is in the retrieval of the characteristic parameter values and the construction of the shifted characteristic parameter bands 312. A shifted characteristic parameter band 312 with values from many memory cells will have a greater number of shifts in the characteristic parameter values. If the shifts create enough of an overlap between a larger band and a smaller band distinguishing between two bands with a maximum likelihood estimator will become ineffective. When the number of memory cells with characteristic parameter values in each initial characteristic parameter band 308 is substantially uniform the maximum likelihood estimator may be effectively employed on the shifted characteristic parameter bands 312 to determine which band a particular value belongs to. An aspect of the present invention details a method for transforming an original collection data containing multi-bit values arbitrarily distributed across the binary multi-bit values assigned to the initial characteristic parameter bands 312 to a transformed collection of data containing multi-bit values substantially uniformly distributed across the binary multi-bit values assigned to the initial characteristic parameter bands 312.

Figure 4A:
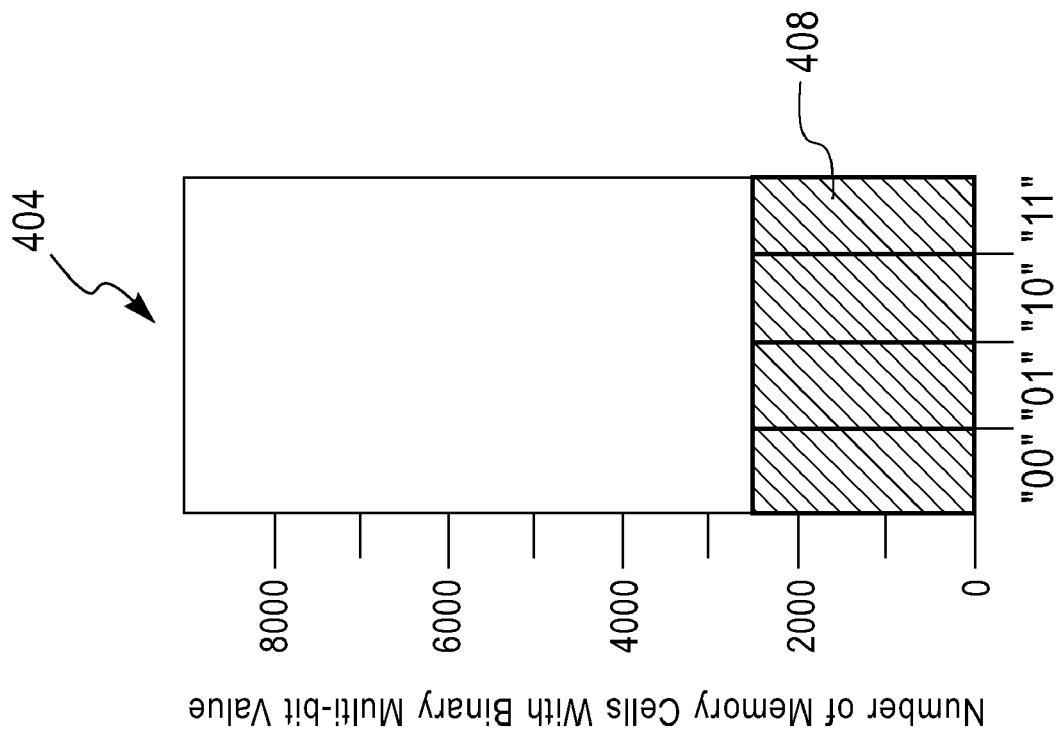
FIGS. 4A and 4B illustrate data transformation in accordance with this invention.

Now turning to FIG. 4A, a histogram for the original collection of data 402 in a 2-bit memory scheme is shown. The binary multi-bit values from the original collection of data 406 are highly non-uniform in this example. The binary multi-bit values "00" and "01" require approximately 500 memory cells each, "10" requires approximately 8000 memory cells for storage, and "11" requires approximately 1000 memory cells. A transformation is employed to produce a more uniform collection of data as shown in FIG. 4B.

Figure 4B:
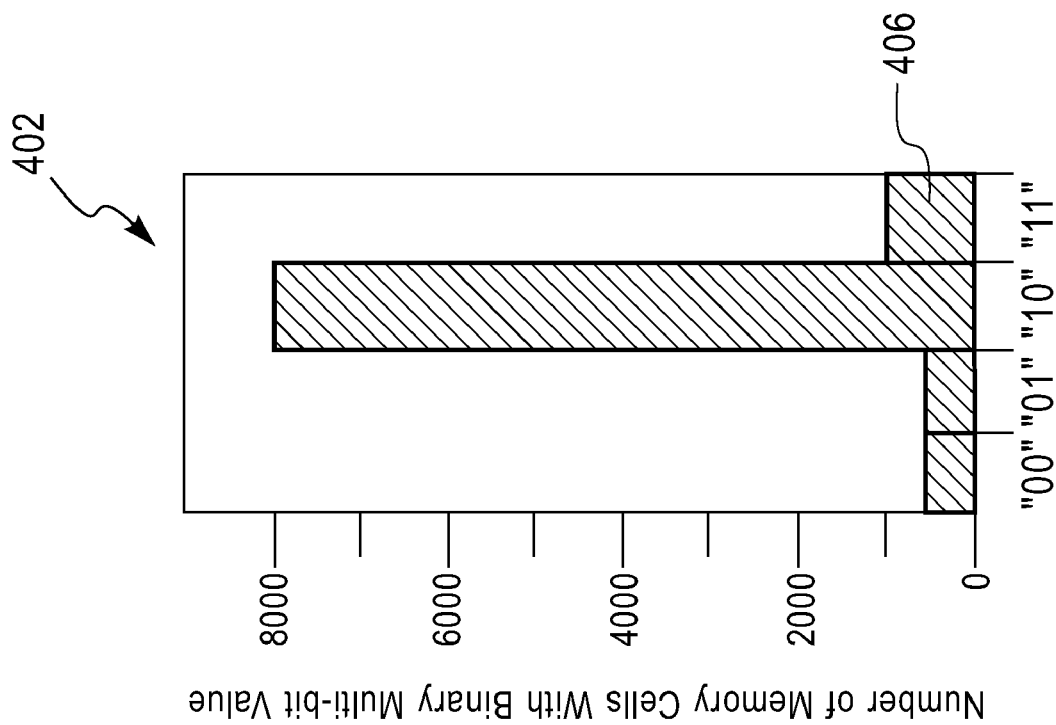

FIG. 4B illustrates a histogram for the transformed collection of data 408. The binary multi-bit values from the transformed collection of data 408 are uniformly distributed in comparison to the binary multi-bit values from the original collection of data 406. Each word in the uniformly distributed bit-stream appears about 2500 times. Now the statistical operations mentioned above can be used with greater precision on the collection of memory cells.

In an embodiment of this invention, binary multi-bit values from the original collection of data 406 are transformed into binary multi-bit values from the transformed collection of data 408. The transformation of the original collection of data to the transformed collection of data comprises combining each binary multi-bit value in the original collection of data 406 with a repeating series of distribution values using a reversible mathematical operator. In an embodiment of the invention the reversible mathematical operator has an inverse mathematical operator for inverse transformations and the reversible mathematical operator has associative and commutative properties.

In one particular embodiment of the invention, the transformation can be mathematically represented as, $$B(n)=A(n) \oplus D([n]mod2^k)$$

where B is the transformed collection of data, A is the original collection of data, D is the repeating series of distribution values, $A(n)$ is the $n^{th}$ binary multi-bit value in A, $B(n)$ is the $n^{th}$ binary multi-bit value in B, $D([n]mod\, 2^k)$ is the value in D at the position given by n modulo $k^{th}$ power of 2, or equivalently, the reminder when the number n is divided by $k^{th}$ power of 2 (note that this is always an integer greater than or equal to 0 and strictly less than the $k^{th}$ power of 2); n is the position of the binary multi-bit value in the original collection of data, and k is the number of bits in each word. The repeating series of distribution values D contains all possible multi-bit values with k number of bits, these multi-bit values appearing in any arbitrarily chosen order. the repeating series of distribution values can be generated or obtained by, but not limited to, a partial address value of the memory cell in the memory cell collection where the binary multi-bit value will be stored, or a stream position of the binary multi-bit value from the original collection of data when the original collection is received as a data stream. Note that every binary multi-bit value in the original collection of data must have the same number of bits.

The mathematical operator, $\oplus$, can be any mathematical operator satisfying the associative and commutative properties, and has an inverse mathematical operator. An example of such an operator is the XOR function. Another example of such a function is the XNOR function. For the purpose of illustration, consider a 2-bit 6 binary multi-bit value original collection of data. The values are "00", "11", "11", "00", "10", and "00". The values will be transformed using the XOR function. In practice a sufficiently large collection of data is needed to maintain a high sample size for each characteristic parameter band and uniformity. In mathematical terms, this can be represented as $A(0)=00, A(1)=11, A(2)=11, A(3)=00, A(4)=10$, and $A(5)=00$. In the example below, D is chosen arbitrarily to be $D(0)=11, D(1)=10, D(2)=01$ and $D(3)=00$. So the transformation would produce, B(0)=00 XOR D(0 mod 4)=00 XOR D(0)=00 XOR 11=11,
B(1)=11 XOR D(1 mod 4)=11 XOR D(1)=11 XOR 10=01,
B(2)=11 XOR D(2 mod 4)=11 XOR D(2)=11 XOR 01=10,
B(3)=00 XOR D(3 mod 4)=00 XOR D(3)=00 XOR 00=00,
B(4)=10 XOR D(4 mod 4)=10 XOR D(0)=10 XOR 11=01,
B(5)=00 XOR D(5 mod 4)=00 XOR D(1)=00 XOR 10=10.

These B values are now the transformed collection of data to be stored in the collection of memory cells.

The binary multi-bit values stored in the collection of memory cells are retrieved as the transformed collection of data. The transformation of the binary multi-bit values from the transformed collection of data 408 back to the binary multi-bit values from the original collection of data 406 is performed by an inverse mathematical transformation. In an embodiment of the invention the inverse mathematical transformation is, $$A(i)=B(i) \oplus^{-1} D([n]mod2^k)$$

where $\oplus^{-1}$ is the inverse mathematical operator. The same distribution value from the repeating series of distribution values used by the transformation for the binary multi-bit value from the original collection of data 406 to the binary multi-bit value from the transformed collection of data 408 is used for the inverse transformation. In the case of a system utilizing the XOR function, the inverse operator of XOR is XOR.

Figure 5A:
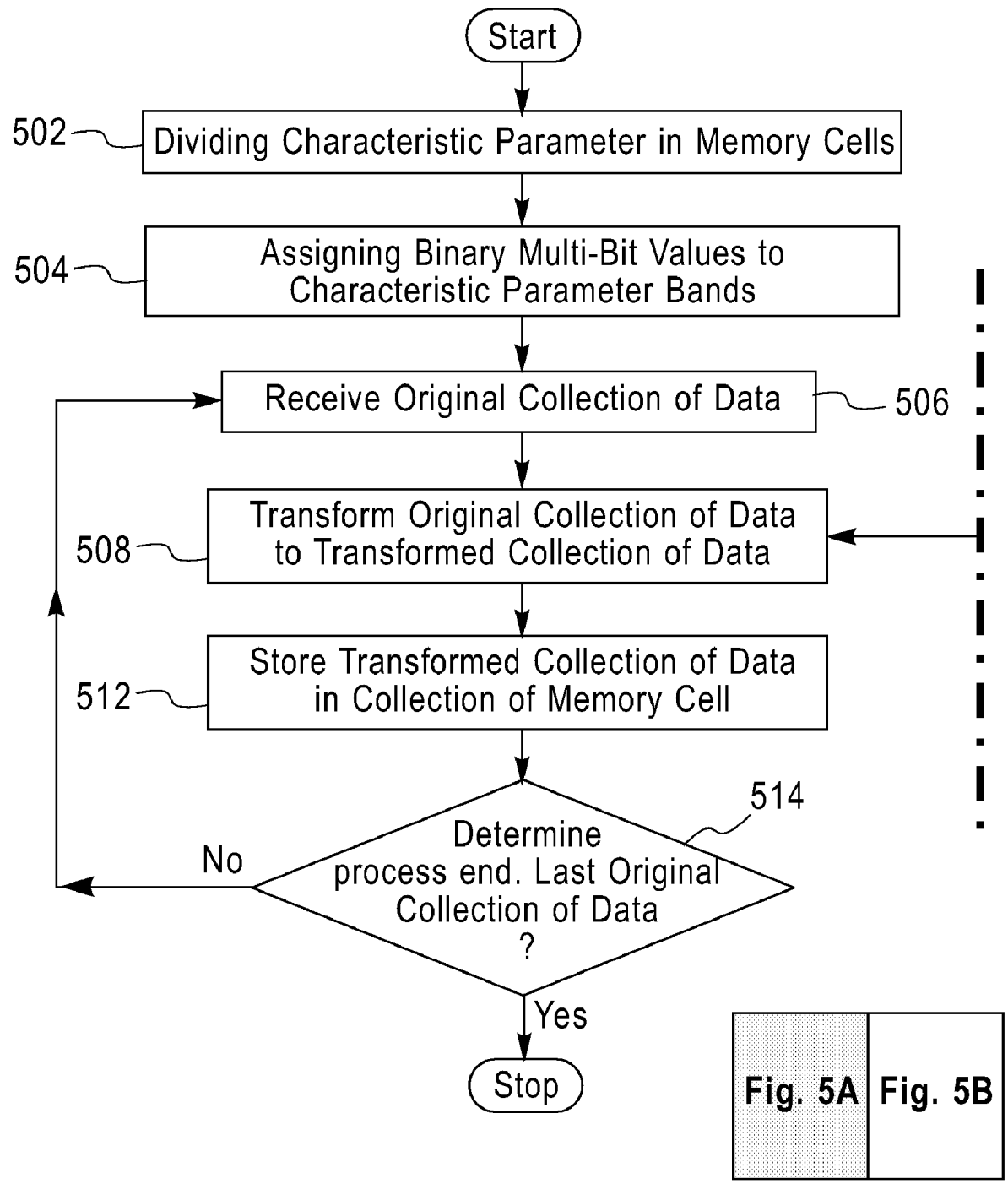
FIG. 5 illustrates data transformation operation flow according to one embodiment of the present invention.
Figure 5B:
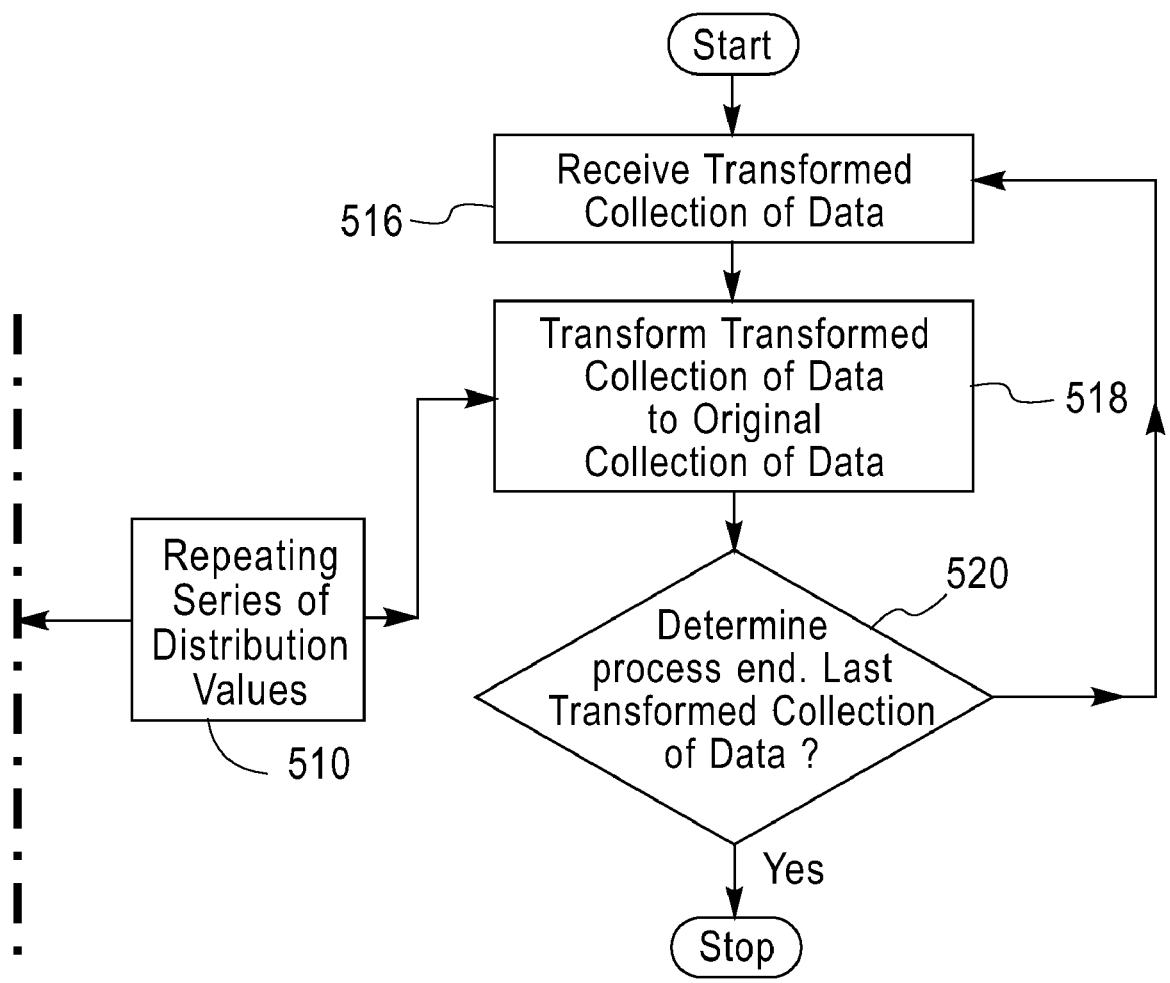

Now turning to FIGS. 5A and 5B, a data transformation flowchart in accordance with an embodiment of the present invention is shown. It will be understood that each block of the flowchart, and combinations of blocks in the flowchart, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

As will be appreciated by one skilled in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device or a magnetic storage device.

FIG. 5A illustrates the storage operations in an embodiment of the invention. The process flow begins at dividing operation 502. During the dividing operation 502, a characteristic parameter in each memory cell of a collection of memory cells is divided into a plurality of characteristic parameter bands. As mentioned above, the present invention is not limited to a particular memory storage technology and various characteristic parameters may be used to store data in accordance with the invention. The number of divisions of the characteristic parameter depends on the number of bits each memory cell is programmed to store. A binary multi-bit system generally requires $2^k$ characteristic parameter bands, where k is the number of bits each memory cell is programmed to store. After the characteristic parameter has been divided into the characteristic parameter bands the control moves to assigning operation 504.

At assigning operation 504, each binary multi-bit value the memory cells in the memory cell collection may store is assigned to the characteristic parameter bands. As shown back in FIG. 3, a linear binary assignment scheme may be used; however, other assignment schemes, such as Grey code, may be used in accordance with the invention. After assigning operation 504 is completed, control passes to receiving operation 506.

At receiving operation 506, an original collection of data is received. The original collection of data has binary multi-bit values arbitrarily distributed across the binary multi-bit values assigned to the plurality of characteristic parameter bands. Furthermore, each binary multi-bit value in the original collection of data has the same number of bits. After receiving operation 506 is completed, control passes to transforming operation 508.

At transforming operation 508, the original collection of data is transformed into a transformed collection of data. The transformed collection of data has binary multi-bit values substantially uniformly distributed across the binary multi-bit values assigned to the plurality of characteristic parameter bands. The binary multi-bit values in the transformed collection of data have the same number of bits as the binary multi-bit values in the original collection of data. Note that regardless of how uniformly distributed the binary multi-bit values are in the original collection of data, the original collection of data will be transformed. Transformation of the original collection of data is performed by combining each binary multi-bit value in the original collection of data with a repeating series of distribution values 510 using a reversible mathematical operator. The reversible mathematical operator has an inverse mathematical operator and has associative and commutative properties. Examples of such a mathematical operator are the XOR and XNOR functions As mentioned above the repeating series of distribution values 510 may be obtained by modular functions on the binary multi-bit value position, memory cell partial block addresses, and data stream position. After the transforming operation 508 is finished, control moves to storing operation 512.

At storing operation 512, each of the binary multi-bit value in the transformed collection of data is stored to one memory cell in the collection of memory cells. The binary multi-bit values in the transformed collection of data are converted to characteristic parameters within the characteristic parameter band associated with the binary multi-bit value being stored. After the storing operation 512 is completed, control passes to determining operation 514.

At determining operation 514, a determination is made as to whether there are additional collections of data that require transformation and storage. If there are more collections of data that require storage operations the system moves to the next original collection of data and the control flow passes back to dividing operation 502. If the original collection of data is at the last or only data value that requires storage, the process ends.

FIG. 5B illustrates the retrieval and inverse mathematical transformation operations in one embodiment of the invention. As illustrated, the process flow begins at receiving operation 516. At receiving operation 516, the transformed collection of data is received as characteristic parameter values representing the binary multi-bit values in the transformed collection of data. Once the characteristic parameter values have been received the characteristic parameter values are converted to the binary multi-bit values they represent. In one embodiment of the invention, an analog sense amplifier and analog-to-digital converter circuit perform the receiving operation 516.

In a particular embodiment of the invention, converting the characteristic parameter values to binary multi-bit values includes sensing shifted values of the characteristic parameter for each memory cell in the collection of memory cells. A probability distribution function is then generated for each of the possible binary multi-bit values from the shifted values of the characteristic parameter for each memory cell. A probability that the stored characteristic parameter values from the collection of memory cells are within the probability distribution function is determined for each of the possible binary multi-bit values. Furthermore, the characteristic parameter values received from the collection of memory cells are converted into binary multi-bit values for which the probability is highest. After receiving operation 516 is completed, process flow passes to transforming operation 518.

At transforming operation 518, the transformed collection of data is transformed back to the original collection of data by an inverse transformation. The inverse transformation is performed by combining the transformed collection of data with the repeating series of distribution values 510 using the inverse mathematical operator. The same distribution value from the repeating series of distribution values 510 used by the transformation for the binary multi-bit value from the original collection of data to the binary multi-bit value from the transformed collection of data is used for the inverse transformation. After the inverse transformation is completed by the transforming operation 518, control passes to determining operation 520.

At determining operation 520, a determination is made as to whether there are additional collections of data that require retrieval and transformation. If there are more collections of data that require retrieval operations the system moves to the next transformed collection of data and the control flow passes back to receiving operation 516. If the transformed collection of data is the last or only transformed collection of data that requires retrieval operations the process ends.

Figure 6:
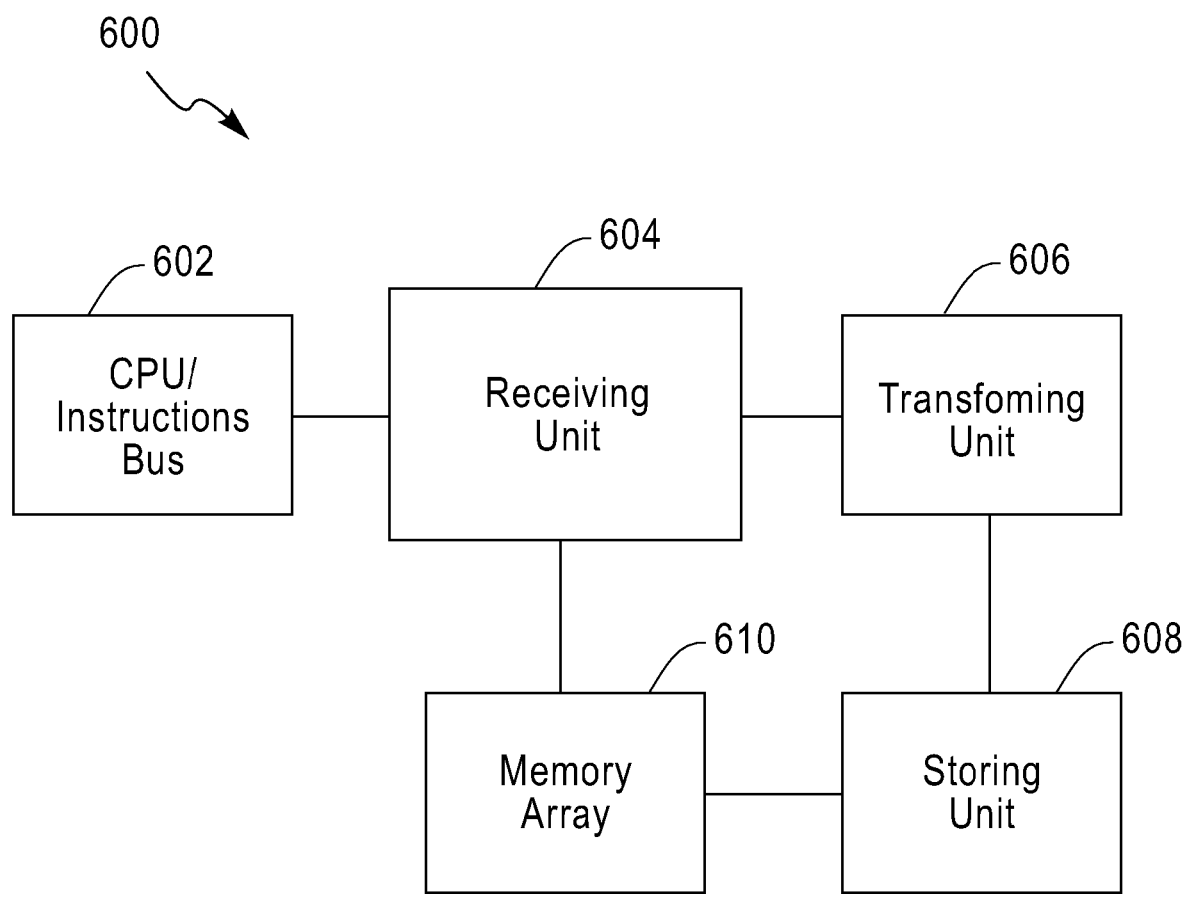
FIG. 6 illustrates a data transformation memory device according to one embodiment of the present invention.

Referring to FIG. 6, one illustrative embodiment of a memory controller 600 contemplated by the present invention is shown. The memory controller 600 includes a receiving unit 604, a transforming unit 606, and a storing unit 608 for transformation and storage operations.

The receiving unit 604 receives an original collection of data with binary multi-bit values arbitrarily distributed across the binary multi-bit values assigned to the plurality of characteristic parameter bands from a CPU via a data/instructions bus 602. In one embodiment of the invention the receiving unit 604 also receives a transformed collection of data from a memory array 610. The receiving unit 604 senses shifted values of characteristic parameter for each of the memory cells in the collection of memory cells. The receiving unit 604 generates a probability distribution function of the characteristic parameter values for each of the possible binary multi-bit values from the shifted values of the characteristic parameter for each of the memory cells in the collection of memory cells. The receiving unit 604 also determines a probability that the stored characteristic parameter values from the collection of memory cells are within the probability distribution function for each of the possible binary multi-bit values. Finally, the receiving unit 604 converts the stored characteristic parameter values from the collection of memory cells into the binary multi-bit values for which the probability is highest.

The transforming unit 606 transforms the original collection of data to the transformed collection of data. As mentioned above, the transformed collection of data has binary multi-bit values substantially uniformly distributed across the binary multi-bit values assigned to the plurality of characteristic parameter bands. The transformation of the original collection of data is performed by combining each binary multi-bit value in the original collection of data with a repeating series of distribution values using a reversible mathematical operator. As mentioned above, the repeating series of distribution values can be obtained in several ways, such as, but not limited to using a partial address value of the memory cell in the collection of memory cells where the binary multi-bit value will be stored and using a stream position of the binary multi-bit value from the original collection of data. The reversible mathematical operator has an inverse mathematical operator, as well as associative and commutative properties.

In one embodiment of the invention, the transforming unit 606 also transforms the transformed collection of data back to the original collection of data. The inverse transformation is performed by combining the transformed collection of data with the repeating series of distribution values by the inverse mathematical operator. The same distribution value from the repeating series of distribution values used by the transformation for the binary multi-bit value from the original collection of data to the binary multi-bit value from the transformed collection of data is used for the inverse transformation.

The storing unit 608 stores the binary multi-bit values from the transformed collection of data by first converting the binary multi-bit values to characteristic parameter values within the characteristic parameter bands associated with the binary multi-bit values. The storing unit 608 stores the characteristic parameter values to the collection of memory cells.

The aforementioned method for operating a memory cell system is compatible with both structural devices programmed and configured for the method and computer software written with computer executable instructions configured for the method.

Having described preferred embodiments for multi-level memory error detection and correction systems and methods (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for operating a collection of memory cells, the method comprising:
   dividing a characteristic parameter of the collection of memory cells into a plurality of characteristic parameter bands;
   assigning binary multi-bit values to each of the plurality of characteristic parameter bands;
   receiving an original collection of data, the original collection of data having binary multi-bit values arbitrarily distributed across the binary multi-bit values assigned to the plurality of characteristic parameter bands;
   transforming the original collection of data into a transformed collection of data using a reversible mathematical operator, the transformed collection of data having binary multi-bit values substantially uniformly distributed across the binary multi-bit values assigned to the plurality of characteristic parameter bands; and storing the transformed collection of data as characteristic parameter values representing the binary multi-bit values in the collection of memory cells.

2. The method of claim 1, further comprising:
receiving the transformed collection of data; and
transforming the transformed collection of data back to the original collection of data using an inverse mathematical operator to the reversible mathematical operator used to transform the original collection of data to the transformed collection of data, the original collection of data having values arbitrarily distributed across the binary multi-bit values assigned to the plurality of characteristic parameter bands.

3. The method of claim 2, wherein receiving the transformed collection of data further comprises:
sensing shifted values of the characteristic parameter for each of the memory cells in the collection of memory cells;
generating a probability distribution function of the characteristic parameter values for each of the possible binary multi-bit values from the shifted values of the characteristic parameter for each of the memory cells in the collection of memory cells;
determining a probability that the stored characteristic parameter values from the collection of memory cells are within the probability distribution function for each of the possible binary multi-bit values; and
converting the stored characteristic parameter values from the collection of memory cells into the binary multi-bit values for which the probability is highest.

4. The method of claim 1, wherein transforming the original collection of data to the transformed collection of data further comprises combining the original collection of data with a repeating series of distribution values using the reversible mathematical operator to form the transformed collection of data.

5. The method of claim 4, wherein the repeating series of distribution values is (n modulo $2^k$) or an arbitrary permutation thereof, where n is a position of the binary multi-bit value from the original collection of data and k is the number of bits in the binary multi-bit value.

6. The method of claim 4, wherein the repeating series of distribution values is at least a partial address value of the memory cell in the collection of memory cells where the binary multi-bit value will be stored.

7. The method of claim 4, wherein the repeating series of distribution values is a partial stream position of the binary multi-bit value from the original collection of data, the original collection of data being received as a data stream.

8. The method of claim 1, wherein the reversible mathematical operator has an inverse mathematical operator, the inverse mathematical operator used for inverse transformations, the reversible mathematical operator having associative and commutative properties.

9. The method of claim 1, wherein the reversible mathematical operator is an exclusive NOR (XNOR) operator.

10. The method of claim 1, wherein the reversible mathematical operator is an exclusive OR (XOR) operator.

11. A memory device, comprising:
memory cells organized into a memory cell collection, each memory cell in the memory cell collection is configured to store a binary multi-bit value delimited by characteristic parameter bands of a characteristic parameter;
a receiving unit for receiving an original collection of data, the original collection of data having binary multi-bit values arbitrarily distributed across the binary multi-bit values assigned to the plurality of characteristic parameter bands;
a transforming unit for transforming the original collection of data into a transformed collection of data using a reversible mathematical operator, the transformed collection of data having binary multi-bit values substantially uniformly distributed across the binary multi-bit values assigned to the plurality of characteristic parameter bands; and
a storing unit for storing the transformed collection of data as characteristic parameter values representing binary multi-bit values in the collection of memory cells.

12. The memory device of claim 11, wherein the transforming unit is further configured to transform the transformed collection of data back to the original collection of data using an inverse mathematical operator.

13. The memory device of claim 11, wherein the receiving unit is further configured to:
receive the transformed collection of data;
sense shifted values of the characteristic parameter for each of the memory cells in the collection of memory cells;
generate a probability distribution function of the characteristic parameter values for each of the possible binary multi-bit values from the shifted values of the characteristic parameter for each of the memory cells in the collection of memory cells;
determine a probability that the stored characteristic parameter values from the collection of memory cells are within the probability distribution function for each of the possible binary multi-bit values; and
convert the stored characteristic parameter values from the collection of memory cells into the binary multi-bit values for which the probability is highest.

14. The memory device of claim 11, wherein the transforming unit is further configured to combine the original collection of data with a repeating series of distribution values using the reversible mathematical operator to form the transformed collection of data.

15. The memory device of claim 14, wherein the repeating series of distribution values is (n modulo $2^k$) or an arbitrary permutation thereof, where n is a position of the binary multi-bit value from the original collection of data and k is the number of bits in the binary multi-bit value.

16. The memory device of claim 14, wherein the repeating series of distribution values is at least a partial address value of the memory cell in the collection of memory cells where the binary multi-bit value will be stored.

17. The memory device of claim 14, wherein the repeating series of distribution values is a partial stream position of the binary multi-bit value from the original collection of data, the original collection of data being received as a data stream.

18. The memory device of claim 11, wherein the reversible mathematical operator is an exclusive NOR (XNOR) operator.

19. The memory device of claim 11, wherein the reversible mathematical operator is an exclusive OR (XOR) operator.

20. The memory device of claim 11, wherein the reversible mathematical operator has an inverse mathematical operator, the inverse mathematical operator used for inverse transformations, the reversible mathematical operator has associative and commutative properties.

21. A computer program product comprising a tangible computer readable medium embodying computer program code for operating at least one memory cell collection, the memory cells in the memory cell collection storing binary multi-bit values delimited by characteristic parameter bands of a characteristic parameter the computer program code comprising computer executable instructions for:

receiving an original collection of data, the original collection of data having binary multi-bit values arbitrarily distributed across the binary multi-bit values assigned to the plurality of characteristic parameter bands;

transforming the original collection of data into a transformed collection of data using a reversible mathematical operator, the transformed collection of data having binary multi-bit values substantially uniformly distributed across the binary multi-bit values assigned to the plurality of characteristic parameter bands; and storing the transformed collection of data as characteristic parameter values representing the binary multi-bit values in the collection of memory cells.

22. The computer program of claim 21, further comprising computer executable instructions for:

receiving the transformed collection of data; and transforming the transformed collection of data back to the original collection of data using an inverse mathematical operator to the reversible mathematical operator used to transform the original collection of data to the transformed collection of data, the original collection of data having binary multi-bit values arbitrarily distributed across the binary multi-bit values assigned to the plurality of characteristic parameter bands.

23. The computer program of claim 22, wherein the computer executable instructions for receiving the transformed collection of data further comprise computer executable instructions for:

sensing shifted values of the characteristic parameter for each of the memory cells in the collection of memory cells;

generating a probability distribution function of the characteristic parameter values for each of the possible binary multi-bit values from the shifted values of the characteristic parameter for each of the memory cells in the collection of memory cells;

determining a probability that the stored characteristic parameter values from the collection of memory cells are within the probability distribution function for each of the possible binary multi-bit values; and converting the stored characteristic parameter values from the collection of memory cells into the binary multi-bit values for which the probability is highest.

24. The computer program of claim 21, wherein the computer executable instructions for transforming the original collection of data to the transformed collection of data further comprise computer executable instructions for combining the original collection of data with a repeating series of distribution values using the reversible mathematical operator to form the transformed collection of data.

25. The computer program of claim 24, wherein the repeating series of distribution values is (n modulo $2^k$) or an arbitrary permutation thereof, where n is a position of the binary multi-bit value from the original collection of data and k is the number of bits in the binary multi-bit value.

26. The computer program of claim 24, wherein the repeating series of distribution values is at least a partial address value of the memory cell in the collection of memory cells where the binary multi-bit value will be stored.

27. The computer program of claim 24, wherein the repeating series of distribution values is a partial stream position of the binary multi-bit value from the original collection of data, the original collection of data being received as a data stream.

28. The computer program of claim 21, wherein the reversible mathematical operator has an inverse mathematical operator, the inverse mathematical operator used for inverse transformations, the reversible mathematical operator having associative and commutative properties.

29. The computer program of claim 21, wherein the reversible mathematical operator is an exclusive NOR (XNOR) operator.

30. The computer program of claim 21, wherein the reversible mathematical operator is an exclusive OR (XOR) operator.

* * * * *